United States Patent
Uetani et al.

(10) Patent No.: US 8,536,766 B2
(45) Date of Patent: Sep. 17, 2013

(54) DEVICE UTILIZING PIEZOELECTRIC ELEMENT

(75) Inventors: Masayuki Uetani, Kasugai (JP); Makoto Tani, Inazawa (JP)

(73) Assignee: NGK Insulators, Ltd., Nagoya (JP)

(*) Notice: Subject to any disclaimer, the term of this patent is extended or adjusted under 35 U.S.C. 154(b) by 265 days.

(21) Appl. No.: 13/069,566

(22) Filed: Mar. 23, 2011

(65) Prior Publication Data
US 2011/0266926 A1    Nov. 3, 2011

(30) Foreign Application Priority Data
Mar. 31, 2010  (JP) .................................. 2010-82175

(51) Int. Cl.
*H01L 41/08* (2006.01)
*H01L 41/083* (2006.01)

(52) U.S. Cl.
CPC .................................. *H01L 41/083* (2013.01)
USPC ........................................................ 310/328

(58) Field of Classification Search
CPC .... H01L 41/09; H01L 41/0986; H02N 2/002; H02N 2/0065; H02N 2/02; H02N 2/026; H02N 2/04; H02N 2/043
USPC ........................................................ 310/328
See application file for complete search history.

(56) References Cited

U.S. PATENT DOCUMENTS
2007/0228885 A1* 10/2007 Manabe ..................... 310/328

FOREIGN PATENT DOCUMENTS
| JP | 2001-094164 A1 | 4/2001 |
| JP | 2002-119074 A1 | 4/2002 |
| JP | 2004-304996 A1 | 10/2004 |
| JP | 2009-123750 A1 | 6/2009 |

* cited by examiner

*Primary Examiner* — Derek Rosenau
(74) *Attorney, Agent, or Firm* — Burr & Brown (57) ABSTRACT

A device using a piezoelectric element includes a layered piezoelectric element and a driven member. The layered piezoelectric element includes an active portion formed of stacked piezoelectric layers each being sandwiched between a first internal electrode layer and a second internal electrode layer, and an inactive portion (first end inactive portion) formed of a first end piezoelectric layer stacked on the active portion. The driven member is bonded to the top surface of the first end piezoelectric layer by means of an adhesive. The piezoelectric layers and the first end piezoelectric layer are formed such that the porosity of the inactive portion is greater than that of the active portion. Therefore, since numerous open pores are emerged on the top surface of the first end piezoelectric layer, the adhesive enters into the open pores to have the driven member be strongly bonded to the top surface.

5 Claims, 9 Drawing Sheets

DEVICE UTILIZING PIEZOELECTRIC ELEMENT

BACKGROUND OF THE INVENTION

1. Field of the Invention

The present invention relates to a device using a piezoelectric element including a layered piezoelectric element and a driven member driven by the layered piezoelectric element.

2. Background Art

Figure 12:
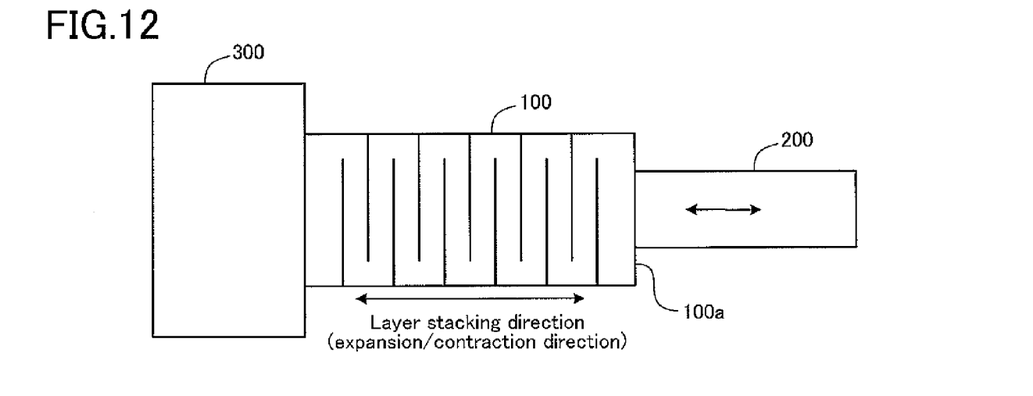
FIG. 12 is a front view of a conventional device using a piezoelectric element.

As shown in FIG. 12, a conventionally known device using a piezoelectric element includes a layered piezoelectric element 100 and a driven member 200 driven by the layered piezoelectric element 100. The driven member 200 is bonded, by means of an adhesive, to one surface 100a of the two end surfaces in the layer stacking direction of the layered piezoelectric element 100 (refer to, for example, Patent document No. 1). The other surface of the end surfaces in the layer stacking direction of the layered piezoelectric element 100 is fixed to, for example, a base 300. The other surface of the end surfaces in the layer stacking direction of the layered piezoelectric element 100 (i.e., the end surface to which the driven member 200 is not bonded) may be a free end surface.

It should be noted that, in the present specification, claims, and drawings (hereinafter may be collectively referred to as "the present specification, etc."), the term "piezoelectric" encompasses "piezoelectric" and "electrostrictive." Therefore, for example, the term "piezoelectric element" encompasses both an element having a piezoelectric effect (i.e., a piezoelectric element) and an element having an electrostrictive effect (i.e., an electrostrictive element).

Figure 13:
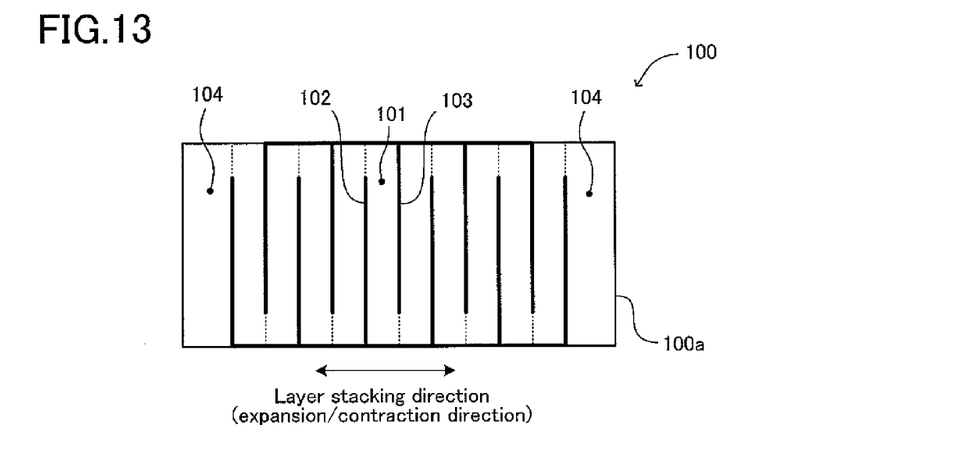
FIG. 13 is a front view of the layered piezoelectric element shown in FIG. 12.

As shown in FIG. 13, the layered piezoelectric element 100 includes a plurality of piezoelectric layers (i.e., layers formed of a piezoelectric material) 101; a plurality of internal electrode layers 102; a plurality of internal electrode layers 103; and a pair of end piezoelectric layers 104. The internal electrode layers 102 are electrically connected to one another. The internal electrode layers 103 are electrically connected to one another. One of the internal electrode layers 102 faces one of the internal electrode layers 103 via one of the piezoelectric layers 101 sandwiched therebetween.

That is, the piezoelectric element 100 is a ceramic layered product in which each of the piezoelectric layers 101 and each of the internal electrode layers (102 and 103) are alternately stacked. Each of the piezoelectric layers 101 is sandwiched between a pair of internal electrode layers 102 and 103 facing each other. A "changing voltage" is applied to each piezoelectric layer 101 through the internal electrode layers 102 and 103 sandwiching the piezoelectric layer 101, and thus a "changing electric field" is applied to the piezoelectric layer 101, whereby the piezoelectric layer 101 expands or contracts in the layer stacking direction. Therefore, a portion of the stacked piezoelectric layers 101, "the portion sandwiched between the internal electrode layers 102 and 103" forms an "active portion KS" (see FIG. 14).

Figure 14:
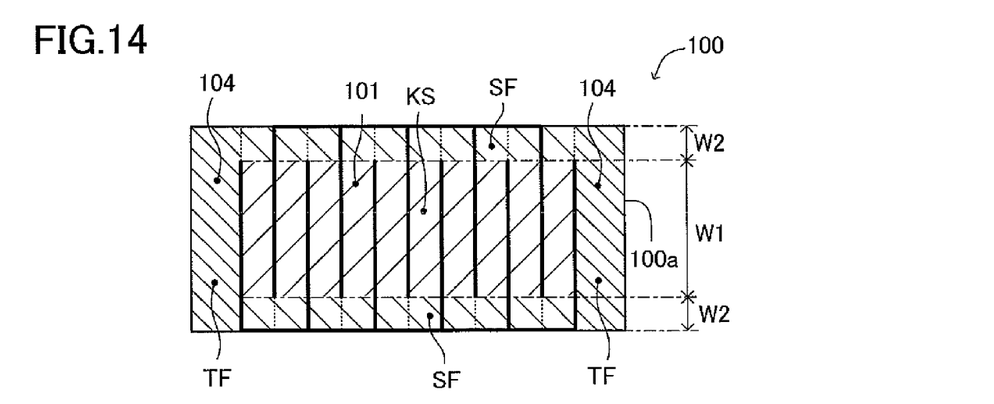
FIG. 14 is a front view of the layered piezoelectric element shown in FIG. 12, which illustrates an active portion, a side inactive portion, and an end inactive portion.

Meanwhile, an electric field cannot be applied to a portion of each piezoelectric layer 101 at which the internal electrode layer 102 does not face the internal electrode layer 103 via the piezoelectric layer 101 (i.e., a portion at which the internal electrode layer 102 and the internal electrode layer 103 do not overlap with each other as viewed in the layer stacking direction, the portion being in the vicinity of each side surface of the piezoelectric element 100). The piezoelectric layer 101 therefore neither expands nor contracts at the portion, and, as shown in FIG. 14, the portion forms a "side inactive portion SF."

A pair of the end piezoelectric layers 104 are respectively provided (stacked) on the two ends of the layered product including the active portion KS and the side inactive portion SF. Since neither of the end piezoelectric layers 104 is sandwiched between the internal electrode layers 102 and 103, an electric field cannot be applied to the end piezoelectric layer 104. Therefore, the end piezoelectric layers 104 neither expand nor contract, and, as shown in FIG. 14, each of the layers 104 forms an "end inactive portion TF." It should be noted that the end piezoelectric layer (end inactive portion TF) 104 may be provided (stacked) on only one end of the layered product including the active portion KS and the side inactive portion SF.

PRIOR ART DOCUMENT

Patent Document

<Patent document No. 1> Japanese Patent Application Laid-Open (kokai) No. 2002-119074

Meanwhile, in order to produce the piezoelectric element 100, polarization treatment must be carried out. Upon polarization treatment, a voltage (i.e., an electric field) is applied to the active portion KS, and thus the active portion KS greatly expands by means of the inverse piezoelectric effect. In contrast, no electric field is applied to the side inactive portion SF, and thus the side inactive portion SF does not expand. Therefore, tensile stress is generated in the side inactive portion SF. As a result, microcracks may be formed in the side inactive portion SF. When bending stress is applied to the piezoelectric element 100, breakage of the piezoelectric element 100 initiates from such a microcrack (i.e., the microcrack becomes a starting point of breakage).

Breakage of the element due to the microcracks formed in the side inactive portion SF is more likely to occur when the width (thickness) W2 of the side inactive portion SF is smaller (i.e., when the side inactive portion SF is thinner). That is, the bending strength of the piezoelectric element 100 becomes lower, as the width W2 of the side inactive portion SF becomes smaller. In other words, as the width W2 of the side inactive portion SF becomes greater, the bending strength of the piezoelectric element 100 becomes higher. However, when the width W2 of the side inactive portion SF is increased, the width W1 of the active portion KS is reduced. Therefore, a new problem arises in that displacement that the layered piezoelectric element 100 exhibits becomes small.

In general, in order to reduce the cost for production of the layered piezoelectric element 100, the layered piezoelectric element 100 is produced by forming a layered piezoelectric product by stacking (layering) green sheets having a large area, and by cutting the layered piezoelectric product (into element chips). However, such a production method causes a variation in width W2 of the side inactive portion SF among the resultant products. Therefore, a piezoelectric element 100 including a side inactive portion SF having a small width W2 and thus having low bending strength is produced at a "certain frequency."

"The cracks generated due to bending stress" tend to propagate along pores contained in the side inactive portion SF. Thus, in the conventional piezoelectric element 100, pores formed in the piezoelectric layer 101 are reduced, to thereby reduce pores contained in the side inactive portion SF. That is, the porosity of the piezoelectric layer 101 is reduced. Therefore, the resultant layered piezoelectric element 100 has high bending strength. In this case, the end piezoelectric layer 104 is formed of the same material as the piezoelectric layer 101, and thus the porosity of the end piezoelectric layer 104 is as low as that of the piezoelectric layer 101.

However, when the piezoelectric element 100 having reduced porosity is applied to "the device using a piezoelectric element" shown in FIG. 12, for the reasons described below, the device using a piezoelectric element poses a problem in that it fails to have sufficiently high "strength against impact, etc. (i.e., bending strength of the entire device using a piezoelectric element)." As used herein, "strength against impact, etc." refers to, for example, sufficient strength to prevent the device using a piezoelectric element from breaking upon being dropped.

The reason why the device using a piezoelectric element fails to have sufficiently high strength against impact, etc. (bending strength) is considered to be as follows. The piezoelectric layer 104 forming the end inactive portion TF is as dense as the piezoelectric layer 101 forming the active portion KS or the side inactive portion SF; i.e., the piezoelectric layer 104 has low porosity. Therefore, the end surface 100a to which the driven member 200 is bonded has a very small number of pits (surface asperities). Thus, the adhesive used for bonding the driven member 200 to the end surface 100a may fail to sufficiently exhibit its anchor effect, and the driven member may fall upon application of impact to the device using a piezoelectric element. As used herein, the "anchor effect" of an adhesive refers to the effect which enhances an adhesive force of the adhesive when the adhesive enters into micropits (fine asperities) on a bonding surface and cures therein. The anchor effect is also called the "fastener effect."

SUMMARY OF THE INVENTION

In view of the foregoing, one of objects of the present invention is to provide a device using a piezoelectric element comprising a layered piezoelectric element including an active portion and an inactive portion (end inactive portion), and a driven member which is bonded to an exposed surface of the inactive portion by means of an adhesive, "the device using a piezoelectric element" having high "strength against impact, etc. (bending strength)."

The device using a piezoelectric element of the present invention (hereinafter may be referred to as "the device of the invention") comprises a layered piezoelectric element and a driven member.

The layered piezoelectric element is a layered product (ceramic layered body) including a plurality of piezoelectric layers and a plurality of internal electrode layers, wherein the piezoelectric layers and the internal electrode layers are stacked alternately "in a layer stacking direction orthogonal to the layer surface of each piezoelectric layer". The layered piezoelectric element includes an active portion in which each of the piezoelectric layers is sandwiched between a pair of internal electrode layers of the internal electrode layers facing each other, and an inactive portion which is provided on at least one end of the active portion in the layer stacking, and which is formed of a single or a plurality of piezoelectric layers that are not sandwiched between the internal electrode layers.

The driven member is bonded to one of exposed surfaces of the inactive portion (i.e., one end of the inactive portion in the layer stacking direction), by means of an adhesive.

The device of the invention is characterized in that the porosity of a portion of the inactive portion, the portion existing within a "specific thickness" as measured from the "surface to which at least the driven member is bonded (i.e., bonding surface)" of the exposed surfaces of the inactive portion (hereinafter the porosity may be referred to as the "inactive portion porosity") is greater than the porosity of the piezoelectric layers forming the active portion (hereinafter the porosity may be referred to as the "active portion porosity").

In this case, when the inactive portion is composed of a single piezoelectric layer, the inactive portion may be formed in such a manner that the porosity of "the entirety of the single piezoelectric layer, or a portion of the piezoelectric layer present directly below the bonding surface" is greater than the porosity of "the piezoelectric layers forming the active portion." Meanwhile, when the inactive portion is composed of a plurality of piezoelectric layers, the inactive portion may be formed in such a manner that the porosity of "the entirety of at least the piezoelectric layer (having the bonding surface) of the plurality of the piezoelectric layers, or a portion of the piezoelectric layer (having the bonding surface) present directly below the bonding surface" is greater than the porosity of the piezoelectric layers forming the active portion.

With this configuration, the porosity of the portion of the piezoelectric layer forming the inactive portion, the portion being present within a specific thickness as measured from the bonding surface, is greater than the porosity of the piezoelectric layers forming the active portion, and thus numerous open pores are emerged on the bonding surface; i.e., numerous pits (surface asperities) are formed on the bonding surface. Therefore, since the anchor effect of the adhesive is utilized, the driven member is strongly bonded to the piezoelectric element. In addition, since the porosity of the piezoelectric layers forming the active portion can be reduced, the porosity of the aforementioned side inactive portion can also be reduced. Thus, microcracks are less likely to be formed in the side inactive portion upon polarization treatment. Therefore, the piezoelectric element itself can maintain high "strength against bending stress." As a result, "the device using a piezoelectric element" having high bending strength (including strength against impact, etc.) is provided.

In the device of the invention, it is preferable that the bonding surface of the inactive portion have undergone surface polishing, and a portion of pores formed in the inactive portion (portion being present within the specific thickness as measured from the bonding surface) are exposed on the bonding surface in the form of open pores through surface polishing.

When the bonding surface is a "surface provided by surface polishing of the end surface of the piezoelectric element," numerous pores formed in "the portion of the inactive portion having high porosity" are exposed on the bonding surface in the form of open pores. Therefore, the anchor effect of the adhesive further effectively is exerted. Thus, the bending strength of the device using a piezoelectric element can be further improved.

The aforementioned surface polishing encompasses, for example, surface grinding and lapping. The abrasive grains of a grinding wheel employed for the aforementioned surface polishing are preferably formed of, for example, "diamond, CBN (cubic boron nitride), or the like" from the viewpoint of processing efficiency. The abrasive grains employed for finishing preferably have a grit number of #400 to #1500, more preferably #600 to #1200. When abrasive grains having a grit number of less than #400 (i.e., coarse abrasive grains) are employed, a large load is applied to the surface (to be processed) of the piezoelectric element, and thus numerous microcracks may be formed on the processed surface of the piezoelectric element, resulting in reduction of the strength of the inactive layer of the piezoelectric element. In contrast, when abrasive grains having a grit number of greater than #1500 (i.e., fine abrasive grains) are employed, the fine abrasive grains tend to cause clogging of grinding wheel, and thus the grinding performance of the grinding wheel is lowered. As a result, a large frictional force is generated between the processed surface of the piezoelectric element and the grinding wheel, and thus the internal electrode layer and the piezoelectric layer are likely to be separated from each other (i.e., interlayer separation is likely to occur).

Figure 4:
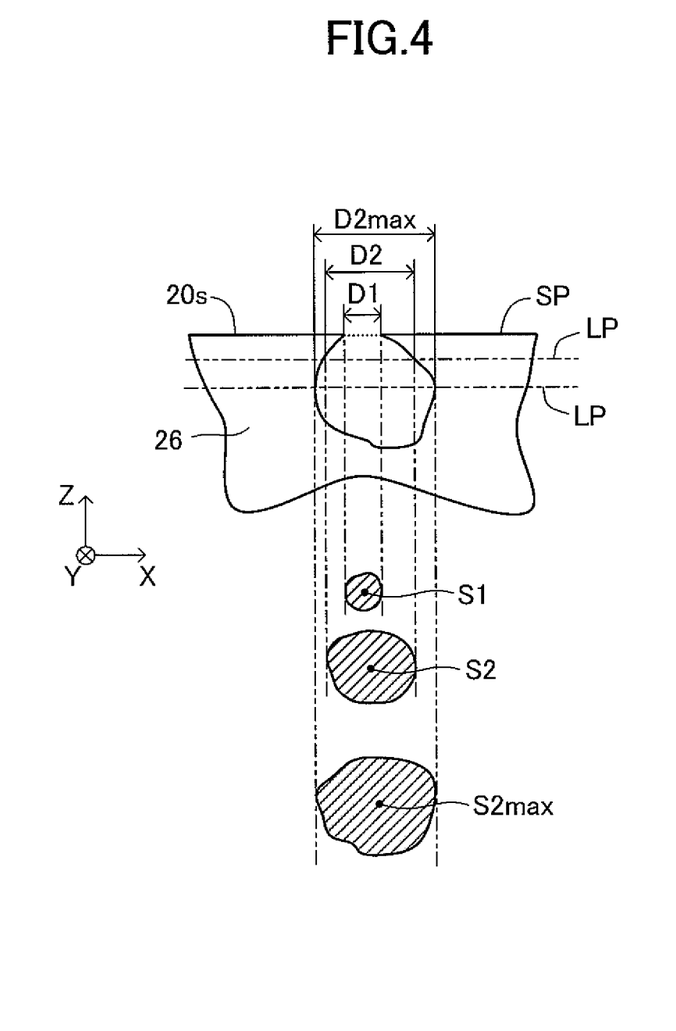
FIG. 4 is a partial cross-sectional view of a portion in the vicinity of the top surface of the layered piezoelectric element shown in FIG. 1.

As shown in FIG. 4, when the device using a piezoelectric element is viewed in cross section obtained by cutting the device along a plane orthogonal to the bonding surface SP, it is preferable that "the length D1 of each of the open pores on the bonding surface SP" be smaller than "the maximum length D2max of the open pore, which is the maximum of lengths D2 of the open pore on the corresponding planes LP that are parallel with the bonding surface SP and are positioned away from the bonding surface SP."

Similarly, as shown in FIG. 4, it is preferable that the area S1 of each of the open pores on the bonding surface SP be smaller than the maximum area S2max of the open pore, which is the maximum of areas S2 of the open pore on the corresponding planes LP that are parallel with the bonding surface SP and are positioned away from the bonding surface SP.

With the configurations above, when the adhesive enters into the open pores and cures therein, the aforementioned anchor effect of the adhesive can be more reliably exerted. As a result, the bending strength of the device using a piezoelectric element can be further improved.

In a specific embodiment of the device using a piezoelectric element of the present invention, it is preferable that the aforementioned active portion porosity A be 1% or less, the aforementioned inactive portion porosity B be 0.8% or more, and the difference in porosity obtained by subtracting the active portion porosity A from the inactive portion porosity B (hereinafter may be referred to as "the porosity difference (B−A)") be 0.2% to 2%.

Experiments have shown that when the active portion porosity is more than 1%, layered piezoelectric elements having low bending strength are produced at high frequency, whereas when the inactive portion porosity is less than 0.8%, the number of open pores is reduced on the bonding surface, and thus the anchor effect is lowered, resulting in reduction of the bonding strength (attributed to the adhesive) of the driven member.

In the case where the porosity difference (B−A) is less than 0.2%, when layered piezoelectric elements having different porosities are produced, the porosity difference may become substantially 0%, resulting in occurrence of piezoelectric elements having low bending strength at high frequency. In contrast, when the porosity difference (B−A) is more than 2%; i.e., the inactive portion porosity becomes excessively high. Therefore, cracks tend to propagate along pores contained in the inactive portion, and thus the inactive portion is likely to be broken before occurrence of breakage at the bonding surface between the layered piezoelectric element and the driven member.

Therefore, when the active portion porosity A and the inactive portion porosity B are controlled as described above, the effect on the bending strength of the piezoelectric element provided by the porosity difference between products due to production tolerance can be reduced, leading to improvement of the impact resistance of the device using a piezoelectric element. Thus, the resultant device using a piezoelectric element having sufficiently high bending strength and high reliability can be provided.

DETAILED DESCRIPTION OF THE INVENTION

Next will be described a device using a piezoelectric element according to an embodiment of the present invention (hereinafter may be referred to as "the present device") with reference to the drawings.

(Structure)

Figure 1:
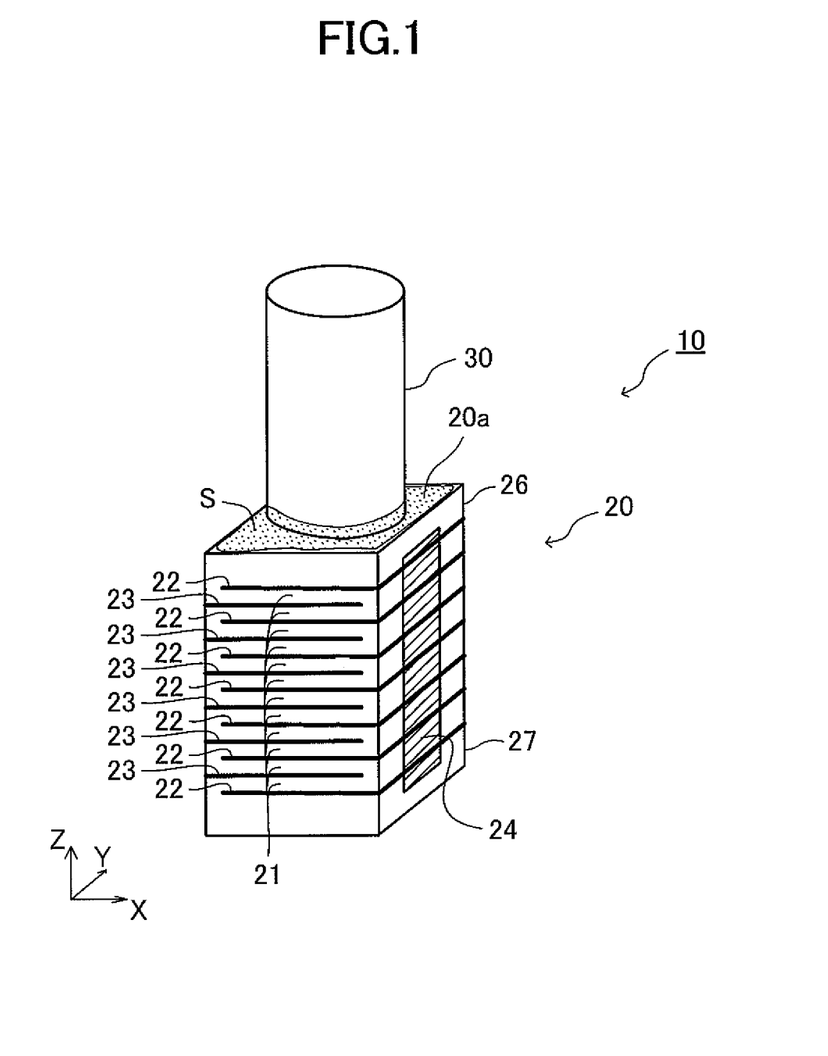
FIG. 1 is a schematic perspective view of a device using a piezoelectric element according to an embodiment of the present invention.

As shown in FIG. 1, the present device 10 includes a layered piezoelectric element (hereinafter may be referred to as "piezoelectric element") 20, and a driven member 30. The driven member 30 is, for example, a rod or a weight, which slides or vibrates by expansion/contraction of the piezoelectric element 20.

Figure 2:
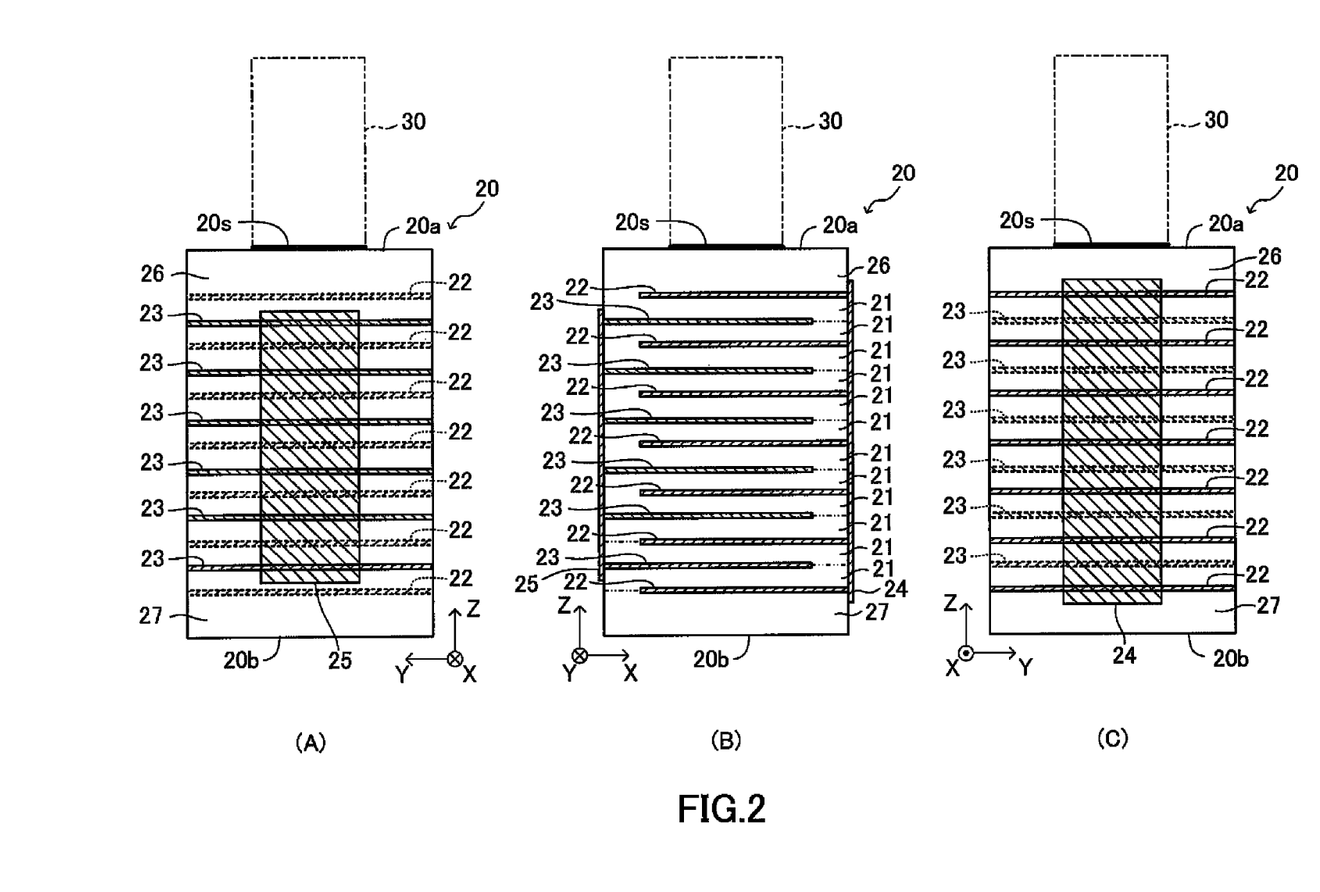
FIG. 2 includes three drawings, (A) being a left side view of the layered piezoelectric element shown in FIG. 1, (B) being a front view of the layered piezoelectric element shown in FIG. 1, and (C) being a right side view of the layered piezoelectric element shown in FIG. 1.

As shown in FIGS. 1 and 2, the piezoelectric element 20 includes a plurality of piezoelectric layers (layers formed of a piezoelectric material) 21; a plurality of first internal electrode layers 22; a plurality of second internal electrode layers 23; a first side electrode 24; a second side electrode 25; a first end piezoelectric layer 26; and a second end piezoelectric layer 27.

The piezoelectric element 20 has a rectangular parallelepiped shape having edges along the X-axis, the Y-axis, and the Z-axis, which are orthogonal to one another. In the present embodiment, the piezoelectric element 20 has a length of 1 mm in an X-axis direction, a length of 1 mm in a Y-axis direction, and a length (height) of 2 mm in a Z-axis direction.

The main component of the piezoelectric layers 21 is a piezoelectric material (e.g., lead zirconate titanate (PZT)). Each piezoelectric layer 21 has a thickness (length in a Z-axis direction) of, for example, 0.019 mm. Each piezoelectric layer 21 is formed of a fired product. Each piezoelectric layer 21 has undergone polarization treatment in a Z-axis direction. Each piezoelectric layer 21 has a square shape (1 mm for each side) as viewed from above. That is, a shape of the piezoelectric layer 21 in a plan view is a square having sides along the X-axis and the Y-axis.

The first internal electrode layers 22 are formed of a conductive material (e.g., Ag—Pd alloy, Ag, or the like). Each of the first internal electrode layers 22 has a thickness of, for example, 0.001 mm. Each of the first internal electrode layers 22 extends, in a Y-axis direction, to both ends (in a Y-axis direction) of the piezoelectric layer 21. Each of the first internal electrode layers 22 extends, in a positive X-axis direction, to the end (in a positive X-axis direction) of the piezoelectric layer 21. Each of the first internal electrode layers 22 extends, in a negative X-axis direction, to the vicinity of the end (in a negative X-axis direction) of the piezoelectric layer 21, but the end (in a negative X-axis direction) of the layer 22 does not reach the end (in a negative X-axis direction) of the piezoelectric layer 21.

The second internal electrode layers 23 are formed of the same conductive material as the first internal electrode layers 22 (e.g., Ag—Pd alloy, Ag, or the like). Each second internal electrode layer 23 has the same thickness as each first internal electrode layer 22. Each of the second internal electrode layers 23 extends, in a Y-axis direction, to both ends (in a Y-axis direction) of the piezoelectric layer 21. Each of the second internal electrode layers 23 extends, in a negative X-axis direction, to the end (in a negative X-axis direction) of the piezoelectric layer 21. Each of the second internal electrode layers 23 extends, in a positive X-axis direction, to the vicinity of the end (in a positive X-axis direction) of the piezoelectric layer 21, but the end (in a positive X-axis direction) of the layer 23 does not reach the end (in a positive X-axis direction) of the piezoelectric layer 21. Each of the second internal electrode layers 23 is positioned so as to face the corresponding first internal electrode layer 22 via the piezoelectric layer 21 sandwiched therebetween. That is, the first internal electrode layer 22 and the second internal electrode layer 23 are provided so as to face each other in such a manner that these layers sandwiches the piezoelectric layer 21.

Figure 3:
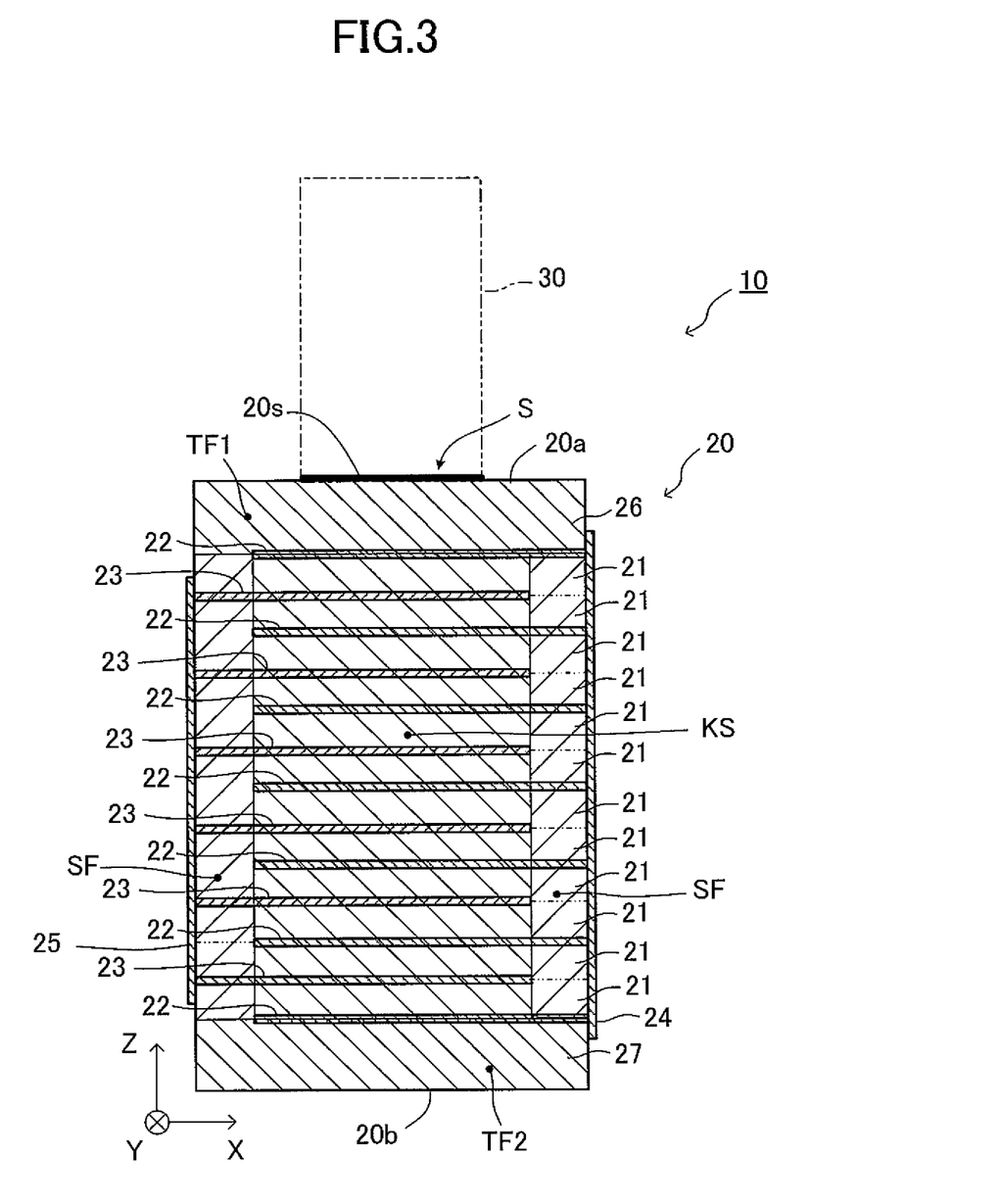
FIG. 3 is a front view of the layered piezoelectric element shown in FIG. 1.

In the piezoelectric element 20, the piezoelectric layers 21, each being sandwiched between the first internal electrode layer 22 and the second internal electrode layer 23, are stacked (or layered) in a Z-axis direction (i.e., a layer stacking direction, or a direction orthogonal to the layer surface of each layer). In other words, the first internal electrode layers 22 and the second internal electrode layers 23 are alternately stacked in such a manner that a pair of the facing layers 22 and 23 sandwiches the corresponding piezoelectric layer 21. No particular limitation is imposed on the number of the piezoelectric layers 21, and the number of the layers 21 is, for example, ninety. However, for the sake of simplification of description, twelve piezoelectric layers 21 are shown in FIGS. 1 to 3.

The first side electrode 24 is an electrode layer formed on the right side surface of the piezoelectric element 20 (i.e., surface at the end in a positive X-axis direction, the surface parallel with a Y-Z plane). The first side electrode 24 is formed of the same conductive material as the first internal electrode layer 22 (e.g., Ag—Pd alloy, Ag, or the like). The first side electrode 24 has a thickness of about 0.01 mm. As viewed from front, the first side electrode 24 has a rectangular form elongated in a height direction of the piezoelectric element 20 (i.e., Z-axis direction). The first side electrode 24 is electrically connected to all the first internal electrode layers 22. The first side electrode 24 is soldered to a non-illustrated conductor wire connected to an external drive circuit.

The second side electrode 25 is an electrode layer formed on the left side surface of the piezoelectric element 20 (i.e., surface at the end in a negative X-axis direction, the surface parallel with a Y-Z plane). The second side electrode 25 is formed of the same conductive material as the first internal electrode layer 22 (e.g., Ag—Pd alloy, Ag, or the like). The second side electrode 25 has a thickness of about 0.01 mm. As viewed from front, the second side electrode 25 has a rectangular form elongated in a height direction of the piezoelectric element 20 (i.e., Z-axis direction). The second side electrode 25 is electrically connected to all the second internal electrode layers 23. The second side electrode 25 is soldered to a non-illustrated conductor wire connected to an external drive circuit.

The first end piezoelectric layer 26 is stacked on the uppermost piezoelectric layer 21 (and on the uppermost first internal electrode layer 22). The first end piezoelectric layer 26 is also called "the upper end piezoelectric layer 26." The first end piezoelectric layer 26 is formed of a single piezoelectric layer. It should be noted, however, the first end piezoelectric layer 26 may be formed of a plurality of stacked piezoelectric layers (see FIG. 10). The main component of the first end piezoelectric layer 26 is the same as that of the piezoelectric layer 21. The first end piezoelectric layer 26 is a fired product. As described hereinbelow in detail, the first end piezoelectric layer 26 has porosity (average porosity) higher than that of the piezoelectric layer 21. As used herein, "porosity" is defined as the ratio of the volume of pores contained in a piezoelectric layer to the unit volume of the piezoelectric layer. In the present embodiment, a cross section of a portion of interest is observed under a scanning electron microscope (SEM) at a magnification of ×1,500 to ×5,000, and the area of all the piezoelectric layers 21 in the observed image and the area of all the pores contained in the layers 21 are calculated by means of image processing software, to thereby determine the ratio of the area of all the pores to the area of all the piezoelectric layers 21 as the porosity. The top surface of the first end piezoelectric layer 26 is exposed. That is, the top surface 20a of the first end piezoelectric layer 26 is one of both end surfaces of the piezoelectric element 20 in a layer stacking direction; i.e., the top surface 20a constitutes the exposed surface 20a of the piezoelectric element 20.

More specifically, the top surface 20a of the first end piezoelectric layer 26 is formed through surface polishing of the top surface of a fired product produced by firing a layered product (a layered body containing layers which have not been fired) including layers which are to be transformed into "the first end piezoelectric layer 26, the piezoelectric layers 21, and the second end piezoelectric layer 27." The first end piezoelectric layer 26 has, for example, a thickness of 0.133 mm before the aforementioned surface polishing, and a thickness of 0.1 mm after the surface polishing.

The surface polishing encompasses, for example, surface grinding and lapping. The abrasive grains of a grinding wheel employed for the aforementioned surface polishing are preferably formed of, for example, "diamond, CBN (cubic boron nitride), or the like" from the viewpoint of processing efficiency. The abrasive grains employed for finishing preferably have a grit number of #400 to #1500, more preferably #600 to #1200. When abrasive grains having a grit number of less than #400 (i.e., coarse abrasive grains) are employed, a large load is applied to the surface to be processed (i.e., the top surface 20a) of the piezoelectric element 20, and thus numerous microcracks are formed on the processed surface of the piezoelectric element 20, resulting in reduction of the strength of the first end piezoelectric layer 26. In contrast, when abrasive grains having a grit number of greater than #1500 (i.e., fine abrasive grains) are employed, the fine abrasive grains tend to cause clogging in the grinding wheel, and thus the grinding performance of the grinding wheel is lowered. As a result, a large frictional force is generated between the processed surface (the top surface 20a) of the piezoelectric element and the grinding wheel, and thus the internal electrode layer (the first or second internal electrode layer 22 or 23) and the piezoelectric layer (the piezoelectric layer 21, or the first or second end piezoelectric layer 26 or 27) are likely to be separated from each other (i.e., interlayer separation is likely to occur) upon surface polishing.

Through this surface polishing, numerous pores contained in the first end piezoelectric layer 26 are emerged in the form of "open pores" on the top surface 20a including the bonding surface 20s. The term "open pore" refers to a pore having an upper portion which is open to the outside. As described above, since the first end piezoelectric layer 26 has porosity higher than that of the piezoelectric layer 21, the area density of open pores emerged on the bonding surface 20s is high.

As shown in FIG. 4, open pores provided (emerged) on the bonding surface 20s (which may be referred to as "bonding surface SP") through surface polishing has a shape as follows:

(1) when the device using a piezoelectric element 10 (i.e., the first end piezoelectric layer 26) is viewed in cross section in a plane (Y-Z plane) orthogonal to the bonding surface SP (X-Y plane), "the length D1 of each of the open pores on the bonding surface SP" is smaller than "the maximum length D2max of the open pore, which is the maximum of lengths D2 of the open pore on the corresponding planes LP that are parallel with the bonding surface SP and are positioned away from the bonding surface SP"; or (2) the area S1 of each of the open pores on the bonding surface SP is smaller than the maximum area S2max of the open pore, which is the maximum of areas S2 of the open pore at the corresponding planes LP that are parallel with the bonding surface SP and are positioned away from the bonding surface SP.

The second end piezoelectric layer 27 is stacked on the lowermost piezoelectric layer 21 of a plurality of the piezoelectric layers 21 (and on the lowermost first internal electrode layer 22). The second end piezoelectric layer 27 is also called "the lower end piezoelectric layer 27." The second end piezoelectric layer 27 is formed of a single piezoelectric layer. It should be noted that, however, the second end piezoelectric layer 27 may be formed of a plurality of stacked piezoelectric layers. The main component of the second end piezoelectric layer 27 is the same as that of the piezoelectric layer 21. The second end piezoelectric layer 27 is a fired product. The second end piezoelectric layer 27 has a porosity higher than that of the piezoelectric layer 21. The second end piezoelectric layer 27 has a thickness of, for example, 0.1 mm. It should be noted that the second end piezoelectric layer 27 may be omitted. Further, the second end piezoelectric layer 27 may have porosity equal to that of the piezoelectric layer 21.

The bottom surface 20b of the second end piezoelectric layer 27 is exposed. That is, the bottom surface 20b of the second end piezoelectric layer 27 is the other one of both end surfaces of the piezoelectric element 20 in a layer stacking direction; i.e., the bottom surface 20b constitutes the exposed surface 20b of the piezoelectric element 20. Similar to the case of the exposed surface 20a, the exposed surface 20b may be subjected to surface polishing. Alternatively, surface polishing of the exposed surface 20b may be omitted.

It should be noted that the front surface of the piezoelectric element 20 (i.e., end surface (parallel with an X-Z plane) in a negative Y-axis direction) and the back surface thereof (i.e., end surface (parallel with an X-Z plane) in a positive Y-axis direction) are each covered with a non-illustrated protective film. The protective film is formed of, for example, an epoxy resin.

As shown in FIG. 3, the thus-configured piezoelectric element 20 includes an active portion KS, a pair of side inactive portions SF, a first end inactive portion TF1, and a second end inactive portion TF2.

The active portion KS corresponds to a portion of each of the stacked piezoelectric layers 21 that is sandwiched between adjacent and facing "first internal electrode layer 22 and second internal electrode layer 23." Specifically, the active portion KS corresponds to a portion which is displaced (i.e., a portion which expands or contracts particularly in a Z-axis (height) direction) through application of a changing electric field thereto by application of a "changing voltage (potential difference)" between the first internal electrode layer 22 and the second internal electrode layer 23.

The side inactive portion SF corresponds to a portion of each of the stacked piezoelectric layers 21 that is not sandwiched between adjacent and facing "first internal electrode layer 22 and second internal electrode layer 23." Specifically, the side inactive portion SF corresponds to a portion where adjacent and facing "first internal electrode layer 22 and second internal electrode layer 23" do not overlap with each other when the piezoelectric element 20 is viewed in (along) a layer stacking direction (Z-axis direction). When the "changing voltage (potential difference)" is applied between the first internal electrode layer 22 and the second internal electrode layer 23, a portion of the piezoelectric layer 21 within the side inactive portion SF is a portion to which the changing electric field is not applied, and thus the portion neither expands nor contracts.

The first end inactive portion TF1 is formed of the first end piezoelectric layer 26, which is not sandwiched between adjacent and facing "first internal electrode layer 22 and second internal electrode layer 23." Therefore, when the "changing voltage (potential difference)" is applied between the first internal electrode layer 22 and the second internal electrode layer 23, the first end inactive portion TF1 is a portion to which the changing electric field is not applied, and thus the portion TF1 neither expands nor contracts.

The second end inactive portion TF2 is formed of the second end piezoelectric layer 27, which is not sandwiched between adjacent and facing "first internal electrode layer 22 and second internal electrode layer 23." Therefore, when the "changing voltage (potential difference)" is applied between the first internal electrode layer 22 and the second internal electrode layer 23, the second end inactive portion TF2 is a portion to which the changing electric field is not applied, and thus the portion TF2 neither expands nor contracts.

As described above, the porosity of the first end piezoelectric layer 26 and the porosity of the second end piezoelectric layer 27 (at least the porosity of the first end piezoelectric layer 26) is higher than that of the piezoelectric layer 21. In other words, the porosity of the first end inactive portion TF1 (and the second end inactive portion TF2) is higher than that of the active portion KS (and the side inactive portion SF). Therefore, as described hereinbelow, the bonding strength of the driven member 30 to the piezoelectric element 20 is enhanced, and thus bending strength (impact resistance) of the entire device using a piezoelectric element 10 is increased.

The driven member 30 has a cylindrical shape. Therefore, the bottom surface of the driven member 30 is flat. The driven member 30 is bonded to the piezoelectric element 20 by bonding the bottom surface of the member 30 to a center portion of the top surface (exposed surface) 20a of the first end piezoelectric layer 26 by means of an adhesive S. The driven member 30 may have a shape other than a cylindrical shape, so long as the surface which is bonded to the top surface (exposed surface) 20a of the first end piezoelectric layer 26 (i.e., the bottom surface of the driven member 30) is flat. Hereinafter, a portion of the top surface (exposed surface) 20a of the first end piezoelectric layer 26 to which the driven member 30 is bonded will be referred to as "bonding surface 20s" for the sake of convenience (see thick solid lines in FIGS. 2 and 3). In other words, the bonding surface 20s corresponds to a "portion of the top surface 20a within a region facing the bottom surface of the driven member 30." Therefore, the following expression "the bottom surface of the driven member 30 is bonded to the exposed surface 20a at the bonding surface 20s" is also applicable.

The driven member 30 is formed of, for example, a material containing, as a main component, any one of "carbon, a heavy metal, a heavy metal carbide, a heavy metal boride, and a heavy metal nitride." The heavy metal (heavy metal element) employed in the driven member is particularly preferably, for example, tungsten or tantalum. Preferably, tungsten carbide (WC), tungsten boride (WB), tantalum nitride (TaN), or the like is employed.

The adhesive S employed is preferably an adhesive having a "tensile shear strength" of 15 N/mm² or more as measured through the method according to "JIS K6850." The adhesive S preferably has a viscosity of 50 to 200 Pa·s before curing. For example, the adhesive S is preferably an epoxy adhesive.

(Production Method)

Figure 5:
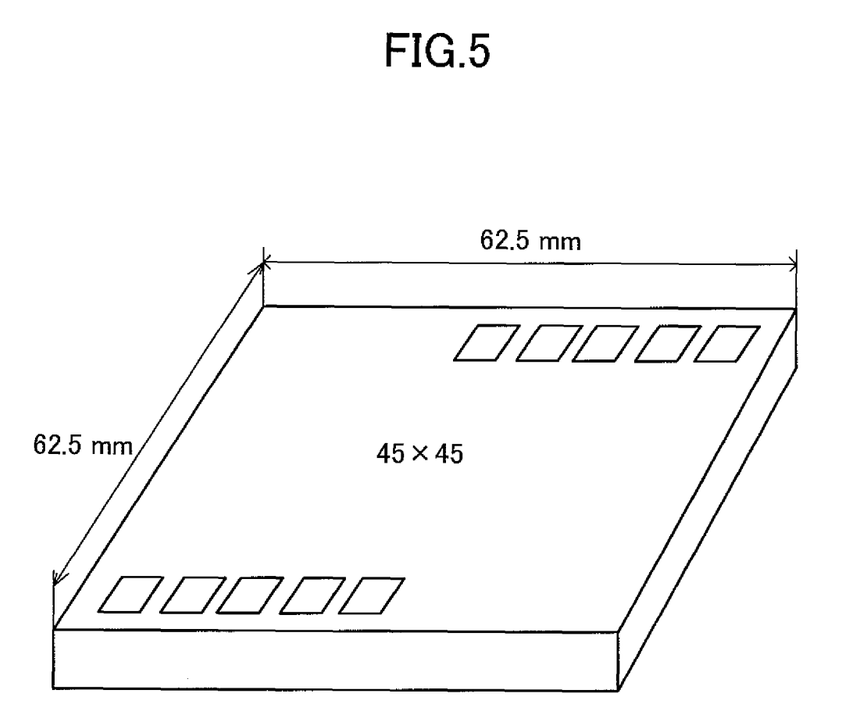
FIG. 5 is a representation for describing steps of producing the layered piezoelectric element shown in FIG. 1.

Next will be briefly described a method for producing/manufacturing the aforementioned device using a piezoelectric element 10. The device using a piezoelectric element 10 is produced through any well known method. As shown in FIG. 5, the piezoelectric element 20 of the device using a piezoelectric element 10 is produced through the following procedure: a fired product containing a plurality of (e.g., 45×45) piezoelectric elements 20 is produced; the fired product is subjected to surface polishing; and the fired product is cut into element chips.

1. First Step (Formation of Piezoelectric Tape)

Firstly, through the doctor blade method, "a plurality of piezoelectric tapes (first piezoelectric tapes that are ceramic green sheets)" which will become the piezoelectric layers 21, and "a plurality of piezoelectric tapes (second piezoelectric tapes that are ceramic green sheets)" which become "the first end piezoelectric layer and the second end piezoelectric layer" are prepared. The first piezoelectric tapes and the second piezoelectric tapes contain the same piezoelectric material. The particle size and particle size distribution of piezoelectric powder employed for tape formation of the second piezoelectric tape, and the packing density of the piezoelectric powder in the thus-formed tape (the volume of the piezoelectric powder per unit volume of the tape) of the second piezoelectric tape are adjusted so that a density of the second piezoelectric tape is lower than that of the first piezoelectric tape after sintering.

2. Second Step (Printing of Internal Electrode Layer)

Subsequently, a conductive layer having a specific pattern is formed on each of the first piezoelectric tapes through screen printing. The conductive layer becomes the first internal electrode layer 22 or the second internal electrode layer 23 after firing.

3. Third Step (Printing of Adhesive Layer)

An adhesive paste is applied to each piezoelectric tape through screen printing.

4. Fourth Step (Layer Stacking)

A plurality of first piezoelectric tapes are stacked on a single second piezoelectric tape, and a single second piezoelectric tape is stacked on the first piezoelectric tapes, to thereby produce a layered product (body). While the layered product is heated, pressure is applied thereto for thermal compression bonding of the stacked piezoelectric tapes.

5. Fifth Step (Degreasing Treatment)

The thus-produced layered product is heated to a specific temperature (a temperature equal to or lower than the firing temperature) for degreasing.

6. Sixth Step (Firing, Main Firing)

The thus-degreased layered product is heated to the firing temperature to be fired, to thereby produce a fired product.

7. Seventh Step (Surface Polishing, Thickness Adjustment)

The top surface of the fired product is subjected to surface polishing. This surface polishing corresponds to the aforementioned "surface polishing of the top surface 20a of the first end piezoelectric layer 26."

8. Eighth Step (Separation/Cutting)

The surface-polished fired product is cut into individual piezoelectric elements 20 through dicing.

9. Ninth Step (Formation of Side Electrode)

The first side electrode 24 and the second side electrode 25 are formed through screen printing.

10. Tenth Step (Formation of Protective Film)

Protective films are formed on the front surface and back surface of the piezoelectric element 20 through screen printing.

11. Eleventh Step (Polarization Treatment)

The piezoelectric layer 21 is subjected to polarization treatment through application of voltage thereto by a well known technique.

12. Twelfth Step (Examination)

The thus-obtained piezoelectric element 20 is examined in terms of electric properties and appearance.

Thereafter, the adhesive S is applied to the top surface 20a of the piezoelectric element 20, and the driven member 30 is bonded thereto. Thus, the device using a piezoelectric element 10 is produced.

In the thus-produced "device using a piezoelectric element 10 having the aforementioned configuration," the porosity of a portion of the piezoelectric layer (in the present embodiment, the entire first end piezoelectric layer 26) forming the inactive portion (the first end inactive portion TF1), the portion being present within a region having a specific thickness as measured from the bonding surface 20s (SP), is greater than the porosity of the piezoelectric layers 21 forming the active portion KS, and thus numerous open pores are emerged on the bonding surface 20s. That is, numerous pits are formed on the bonding surface 20s. Therefore, since the adhesive S exerts its anchor effect, the driven member 30 is strongly bonded to the piezoelectric element 20. Thus, the device using a piezoelectric element 10 can have high bending strength (including strength against impact, etc.).

In addition, since the porosity of the piezoelectric layers 21 forming the active portion KS can be reduced, the porosity of the side inactive portion SF can also be reduced. Thus, microcracks are less likely to be formed in the side inactive portion SF upon polarization treatment of the piezoelectric element 20. Therefore, the piezoelectric element 20 can maintain high "strength against bending stress." Accordingly, the device using a piezoelectric element 10 having excellent bending strength (impact resistance) as the entire device 10 can be provided.

EXAMPLES AND COMPARATIVE EXAMPLES

There were produced various devices using a piezoelectric element (Examples J1 to J6) corresponding to the aforementioned embodiment of the present invention, as well as conventional devices using a piezoelectric element (Comparative Examples H1 to H7). The strength of each device using a piezoelectric element was measured.

In Comparative Examples H1 to H5, the first end piezoelectric layer 26 and the second end piezoelectric layer 27 of the device using a piezoelectric element 10 were replaced with piezoelectric layers similar to the piezoelectric layers 21 (i.e., piezoelectric layers having the same porosity as the piezoelectric layers 21). Actually, the devices using a piezoelectric element of Comparative Examples H1 to H5 were produced by replacing the aforementioned second piezoelectric tape with a "third piezoelectric tape formed of the same material as the aforementioned first piezoelectric tape and having a thickness larger than that of the first piezoelectric tape."

A layer which became a dummy internal electrode layer was formed, through printing, on the top surface of the third piezoelectric tape before layer stacking. The dummy internal electrode layer was removed through the aforementioned surface polishing performed after firing of a layered product. Since the dummy internal electrode layer was served as a sintering aid for the third piezoelectric tape, the sintered third piezoelectric tape was in a sintered state similar to that of the sintered first piezoelectric tape. The Comparative Examples were produced in which the first end piezoelectric layer 26 and the second end piezoelectric layer 27 of the device using a piezoelectric element 10 were replaced with "piezoelectric layers having the same porosity as the piezoelectric layers 21." In the Examples J1 to J6 and Comparative Examples H6 and H7, the porosity of each piezoelectric layer was controlled by adjusting the particle size and particle size distribution of piezoelectric powder employed for formation of a piezoelectric tape, and the packing density of the piezoelectric powder in the thus-formed tape (the volume of the piezoelectric powder per unit volume of the tape).

Figure 6:
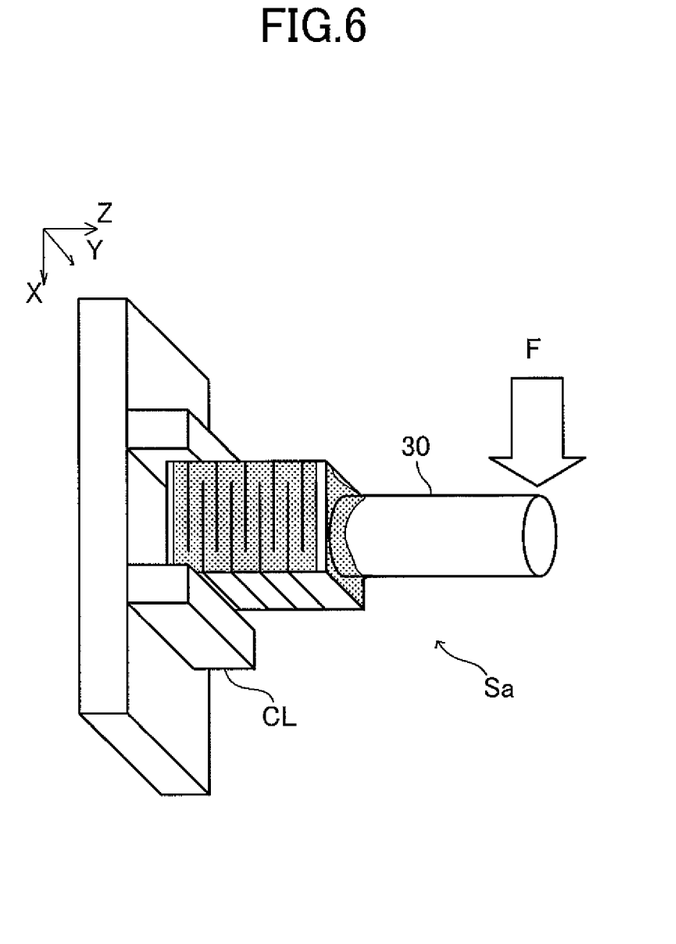
FIG. 6 is a representation for describing a method of measuring load at break in "Examples of the device using a piezoelectric element shown in FIG. 1" and Comparative Examples.

Ten samples for each of Examples J1 to J6 and Comparative Examples H1 to H7, 10 were provided. Thereafter, as shown in FIG. 6, the vicinity of the lower end of the piezoelectric element of each sample Sa of the thus prepared Examples and the Comparative Examples were placed in a holder CL, and a load F was applied to the tip end portion of the driven member 30. The load F was increased, and the breakage point and load at break F of the sample were determined. The results are shown in Table 1.

TABLE 1

|  | Adhesive | Active portion porosity A [%] | Inactive portion porosity B*1 [%] | Porosity difference (B − A)*2 [%] | Load at break [N] | | Minimum load at break [N] |
|  |  |  |  |  | Breakage at inactive portion or adhesive | Breakage at active portion |  |
| --- | --- | --- | --- | --- | --- | --- | --- |
| Comp. Ex. H1 | EP | 0.5% | 0.5% | 0.0% | 5 | —*3 | 5 |
| Comp. Ex. H2 | EP | 1.2% | 1.2% | 0.0% | 19 | 10 | 10 |
| Comp. Ex. H3 | EP | 1.6% | 1.6% | 0.0% | 19 | 8 | 8 |
| Comp. Ex. H4 | EP | 1.9% | 1.9% | 0.0% | 20 | 6 | 6 |
| Comp. Ex. H5 | EP | 2.4% | 2.4% | 0.0% | 12 | 5 | 5 |
| Comp. Ex. H6 | EP | 0.2% | 0.6% | 0.4% | 5 | — | 5 |
| Comp. Ex. H7 | EP | 2.3% | 2.7% | 0.4% | 10 | 6 | 6 |
| Ex. J1 | EP | 0.2% | 2.0% | 1.8% | 20 | 19 | 19 |
| Ex. J2 | EP | 0.2% | 1.0% | 0.8% | 19 | 20 | 19 |
| Ex. J3 | EP | 0.4% | 1.6% | 1.2% | 19 | 19 | 19 |
| Ex. J4 | EP | 0.7% | 2.0% | 1.3% | 20 | 16 | 16 |
| Ex. J5 | EP | 0.8% | 1.0% | 0.2% | 18 | 15 | 15 |
| Ex. J6 | EP | 0.4% | 0.8% | 0.4% | 15 | 19 | 15 |

*1Inactive portion is first end inactive portion.
*2Inactive portion porosity B − active portion porosity A
*3The symbol "—" refers to no occurrence of the corresponding breakage mode.

In Table 1, the adhesive "EP" represents the aforementioned bisphenol-type epoxy adhesive. "Inactive portion" represents the first end inactive portion TF1. In Table 1, "breakage at inactive portion or adhesive" refers to the case of "breakage at the inactive portion" or "breakage at an adhesive layer between the inactive portion and the driven member." "Breakage at adhesive" refers to falling of the driven member from the inactive portion (i.e., piezoelectric element). In the Examples and Comparative Examples where both the load at break of "breakage at inactive portion or adhesive" and the load at break of "breakage at active portion" were obtained, "breakage at inactive portion or adhesive" occurred prior to "breakage at active portion" in some samples of the 10 samples employed in the experiment, and "breakage at active portion" occurred prior to "breakage at inactive portion or adhesive" in the remaining samples.

Figure 7:
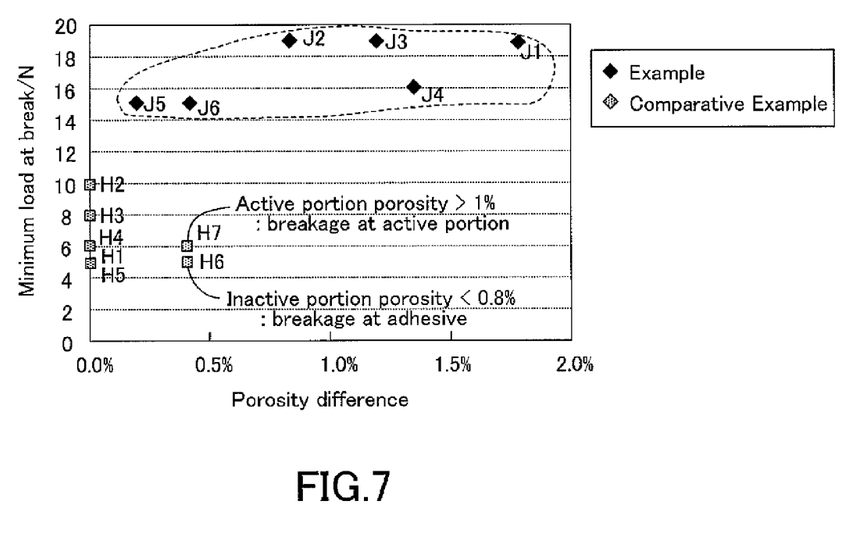
FIG. 7 is a graph obtained by plotting the relationship between minimum load at break, and the difference in porosity between an active layer and a first end inactive layer in "Examples of the device using a piezoelectric element shown in FIG. 1" and Comparative Examples.

FIG. 7 is a graph obtained by plotting data shown in Table 1. The vertical axis of this graph corresponds to minimum load at break, whereas the horizontal axis thereof corresponds to porosity difference. The porosity difference is obtained by subtracting the active portion porosity A (i.e., the porosity of the active portion KS) from the inactive portion porosity B (i.e., the porosity of the first end inactive portion TF1) (porosity difference=B−A). As is clear from this graph, minimum load at break is higher in the Examples wherein porosity difference is more than zero (i.e., Examples J1 to J6) than in the Comparative Examples wherein porosity difference is zero (i.e., Comparative Examples H1 to H5).

It should be noted that even in the case of the device using a piezoelectric element wherein porosity difference is more than zero, when the active portion porosity is higher than the first specific value (1%), the strength of the active portion is greatly reduced, and thus the minimum load at break decreases (see Comparative Example H7). Further, even in the case of the device using a piezoelectric element wherein porosity difference is more than zero, when the inactive portion porosity is lower than the second specific value (0.8%), the minimum load at break decreases (see Comparative Example H6). This is because the number of open pores emerged (provided) on the bonding surface 20s is reduced, and thus the anchor effect of the adhesive S is lowered, resulting in reduction of the bonding strength of the driven member 30 attributed to the adhesive S. As described above, the "anchor effect" of an adhesive refers to the effect of the adhesive to enhance its adhesive force when the adhesive enters into micropits on the bonding surface and cures therein.

Figure 8:
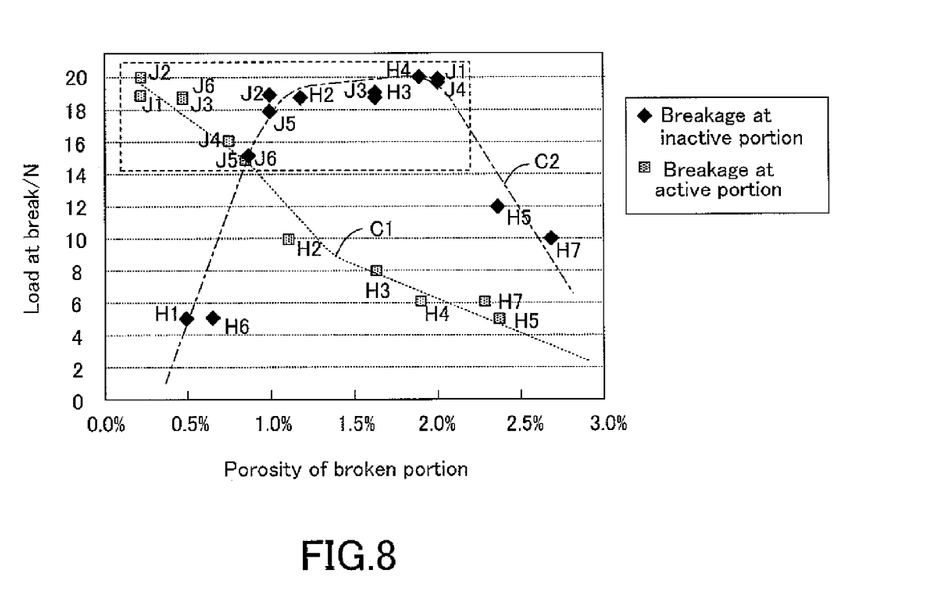
FIG. 8 is a graph obtained by plotting the relationship between load at break and the porosity of broken portion in "Examples of the device using a piezoelectric element shown in FIG. 1" and Comparative Examples.

FIG. 8 is another graph obtained by plotting data shown in Table 1. The vertical axis of this graph corresponds to load at break, whereas the horizontal axis thereof corresponds to "porosity at (of) breakage point." Curve C1 is an extrapolation curve of the load at break in the case where breakage at the active portion occurred prior to "breakage at the inactive portion or the adhesive," whereas curve C2 is an extrapolation curve of the load at break in the case where breakage at the inactive portion or the adhesive occurred prior to "breakage at the active portion." Curve C1 and Curve C2 intersect with each other when the porosity at (of) breakage point is about 0.8%.

These data suggest that, in order to maximize the bending strength of the device using a piezoelectric element without providing the porosity difference, it is inferred that each of the active portion porosity and the inactive portion porosity must be adjusted to about 0.8%. However, as is clear from curve C1, the load at break of the active portion when the active portion porosity is lower than 0.8% is greater than that of the active portion when the active portion porosity is 0.8%. Further, as is clear from curve C2, the load at break of the inactive portion when the inactive portion porosity is higher than 0.8% is greater than that of the inactive portion when the inactive portion porosity is 0.8%. Therefore, when the porosity difference is adjusted to be more than zero in the piezoelectric element, the bending strength of both the active portion and the inactive portion (i.e., the bending strength of the entire device using a piezoelectric element) can be enhanced, as compared with the case where the porosity difference is adjusted to be zero in the piezoelectric element.

In the case where the porosity difference (B−A) is less than 0.2%, when piezoelectric elements having different porosities are produced, the porosity difference may become substantially 0%, resulting in occurrence of piezoelectric elements having low bending strength at high frequency. In contrast, when the porosity difference (B−A) is more than 2%, the inactive portion porosity becomes excessively high. Therefore, cracks tend to propagate along pores contained in the inactive portion, and thus the inactive portion is likely to be broken before occurrence of breakage at the adhesive.

Thus, conceivably, it is preferable that the piezoelectric element 20 be produced so as to satisfy all the following requirements regarding porosity:
(1) the active portion porosity A is less than 1%;
(2) the inactive portion porosity B is 0.8% or more; and
(3) the porosity difference (B−A) is 0.2% to 2%.

As described above, in the device using a piezoelectric element 10 according to the embodiment of the present invention, the porosity of the piezoelectric layer forming the inactive portion TF1 is higher than that of the piezoelectric layer forming the active portion KS. Therefore, numerous open pores are emerged (provided) on the bonding surface 20s, and thus the adhesive S exerts (enjoys) its anchor effect. In addition, the active portion KS can be formed of a dense piezoelectric layer. Accordingly, the device using a piezoelectric element 10 having high strength against impact, etc. can be manufactured. Furthermore, open pores emerged (provided) on the bonding surface 20s through surface polishing have shapes as illustrated in FIG. 4. Therefore, the anchor effect of the adhesive can be further enhanced.

Figure 9:
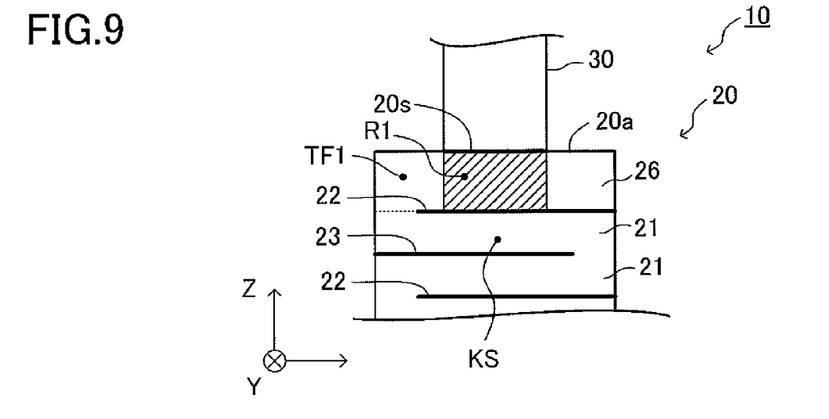
FIG. 9 is a partial cross-sectional view of a first modification of the device using a piezoelectric element shown in FIG. 1.

The present invention is not limited to the aforementioned embodiment, and various modifications may be made within the scope of the present invention. For example, as shown in FIG. 9, the portion having a porosity higher than that of the active portion KS may be only a "portion R1 (shaded portion) present directly below the bonding surface 20s (in a negative Z-axis direction)" of the first end inactive portion TF1.

Figure 10:
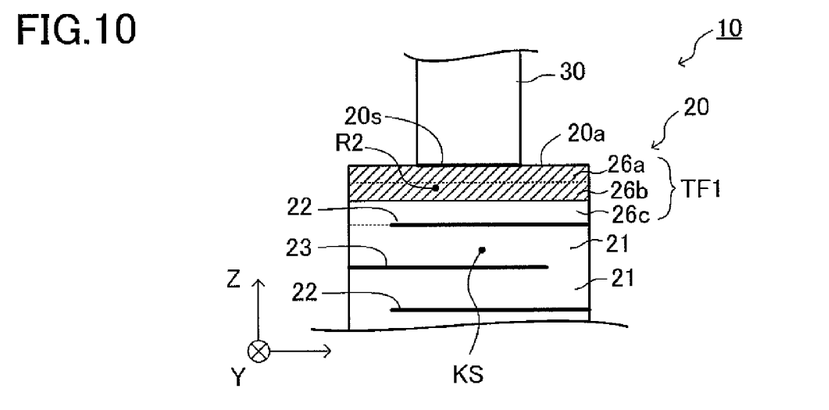
FIG. 10 is a partial cross-sectional view of a second modification of the device using a piezoelectric element shown in FIG. 1.

Furthermore, as shown in FIG. 10, the portion having a porosity higher than that of the active portion KS may be only a "portion R2 (shaded portion) which is present in a region having a specific thickness as measured from the top surface 20a (including the bonding surface 20s)" of the first end inactive portion TF1. Specifically, when, for example, the first end piezoelectric layer 26 is formed of a plurality of layers (layers 26a, 26b, and 26c in FIG. 10), the porosity of a specific number of layers below the top surface 20s (e.g., two of the piezoelectric layers 26a and 26b shown in FIG. 10) may be adjusted to be higher than that of the active portion KS.

Figure 11:
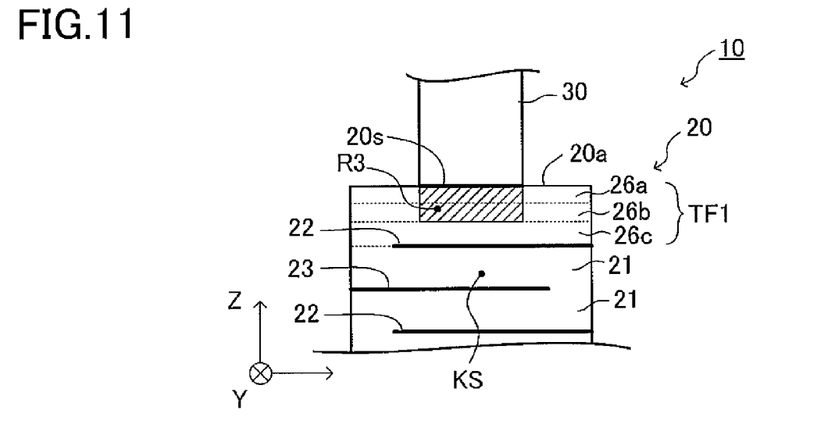
FIG. 11 is a partial cross-sectional view of a third modification of the device using a piezoelectric element shown in FIG. 1.

In addition, as shown in FIG. 11, the portion having a porosity higher than that of the active portion KS may be only a "portion R3 (shaded portion) present directly below the bonding surface 20s and within a region having a specific thickness as measured from the bonding surface 20s" of the first end inactive portion TF1.

Further, the internal electrode layer 22 or 23 may have a shape other than the aforementioned one.

The invention claimed is:
1. A device using a piezoelectric element comprising:
a layered piezoelectric element being a layered product formed of a plurality of piezoelectric layers and a plurality of internal electrode layers, said piezoelectric layers and said internal electrode layers being stacked alternately in a direction orthogonal to said layer surface of each piezoelectric layer, said element including an active portion in which each of said piezoelectric layers is sandwiched between a pair of facing internal electrode layers of said internal electrode layers, and an inactive portion which is provided at least at one of ends of said active portion in a direction orthogonal to said layer surface of each piezoelectric layer, and said inactive portion being formed of a single or a plurality of piezoelectric layers that are not sandwiched between said internal electrode layers; and
a driven member bonded to one of exposed surfaces of said inactive portion by means of an adhesive, wherein:
an inactive portion porosity, which is the porosity of a portion of said inactive portion present in a region having a specific thickness as measured from said bonding surface to which at least said driven member is bonded of said exposed surfaces of said inactive portion, is greater than an active portion porosity, which is the porosity of said piezoelectric layers forming said active portion, and
the porosity of a first part of said inactive portion is different from the porosity of a second part of said inactive portion.

2. A device using a piezoelectric element according to claim 1 wherein said bonding surface is a surface which has undergone surface polishing, and a portion of pores formed in said inactive portion are exposed on said bonding surface as open pores through said surface polishing.

3. A device using a piezoelectric element comprising:

a layered piezoelectric element being a layered product formed of a plurality of piezoelectric layers and a plurality of internal electrode layers, said piezoelectric layers and said internal electrode layers being stacked alternately in a direction orthogonal to said layer surface of each piezoelectric layer, said element including an active portion in which each of said piezoelectric layers is sandwiched between a pair of facing internal electrode layers of said internal electrode layers, and an inactive portion which is provided at least at one of ends of said active portion in a direction orthogonal to said layer surface of each piezoelectric layer, and said inactive portion being formed of a single or a plurality of piezoelectric layers that are not sandwiched between said internal electrode layers; and a driven member bonded to one of exposed surfaces of said inactive portion by means of an adhesive, wherein:

an inactive portion porosity, which is the porosity of a portion of said inactive portion present in a region having a specific thickness as measured from said bonding surface to which at least said driven member is bonded of said exposed surfaces of said inactive portion, is greater than an active portion porosity, which is the porosity of said piezoelectric layers forming said active portion, wherein said bonding surface is a surface which has undergone surface polishing, and a portion of pores formed in said inactive portion are exposed on said bonding surface as open pores through said surface polishing, and wherein, when said device using a piezoelectric element is viewed in cross section in a plane orthogonal to said bonding surface, a length D1 of each of said open pores on said bonding surface is smaller than a maximum length D2max of said open pore, said maximum of lengths D2max being the longest among lengths D of said open pore on corresponding planes that are parallel with said bonding surface and are positioned away from said bonding surface.

4. A device using a piezoelectric element comprising:

a layered piezoelectric element being a layered product formed of a plurality of piezoelectric layers and a plurality of internal electrode layers, said piezoelectric layers and said internal electrode layers being stacked alternately in a direction orthogonal to said layer surface of each piezoelectric layer, said element including an active portion in which each of said piezoelectric layers is sandwiched between a pair of facing internal electrode layers of said internal electrode layers, and an inactive portion which is provided at least at one of ends of said active portion in a direction orthogonal to said layer surface of each piezoelectric layer, and said inactive portion being formed of a single or a plurality of piezoelectric layers that are not sandwiched between said internal electrode layers; and a driven member bonded to one of exposed surfaces of said inactive portion by means of an adhesive, wherein:

an inactive portion porosity, which is the porosity of a portion of said inactive portion present in a region having a specific thickness as measured from said bonding surface to which at least said driven member is bonded of said exposed surfaces of said inactive portion, is greater than an active portion porosity, which is the porosity of said piezoelectric layers forming said active portion, wherein said bonding surface is a surface which has undergone surface polishing, and a portion of pores formed in said inactive portion are exposed on said bonding surface as open pores through said surface polishing, and wherein said area S1 of each of said open pores on said bonding surface is smaller than a maximum area S2max of said open pore, said maximum area S2max being the largest among area S2 of said open pore on said corresponding planes that are parallel with said bonding surface and are positioned away from said bonding surface.

5. A device using a piezoelectric element comprising:

a layered piezoelectric element being a layered product formed of a plurality of piezoelectric layers and a plurality of internal electrode layers, said piezoelectric layers and said internal electrode layers being stacked alternately in a direction orthogonal to said layer surface of each piezoelectric layer, said element including an active portion in which each of said piezoelectric layers is sandwiched between a pair of facing internal electrode layers of said internal electrode layers, and an inactive portion which is provided at least at one of ends of said active portion in a direction orthogonal to said layer surface of each piezoelectric layer, and said inactive portion being formed of a single or a plurality of piezoelectric layers that are not sandwiched between said internal electrode layers; and a driven member bonded to one of exposed surfaces of said inactive portion by means of an adhesive, wherein:

an inactive portion porosity, which is the porosity of a portion of said inactive portion present in a region having a specific thickness as measured from said bonding surface to which at least said driven member is bonded of said exposed surfaces of said inactive portion, is greater than an active portion porosity, which is the porosity of said piezoelectric layers forming said active portion, and wherein said active portion porosity is 1% or less, said inactive portion porosity is 0.8% or more, and a difference in porosity obtained by subtracting said active portion porosity from said inactive portion porosity is 0.2% to 2%.

* * * * *